United States Patent
Robinson et al.

(10) Patent No.: US 6,541,783 B1
(45) Date of Patent: Apr. 1, 2003

(54) STENCIL RETICLE INCORPORATING SCATTERING FEATURES FOR ELECTRON BEAM PROJECTION LITHOGRAPHY

(75) Inventors: Christopher F. Robinson, Hyde Park, NY (US); Werner Stickel, Ridgefield, CT (US)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 09/321,858

(22) Filed: May 28, 1999

(51) Int. Cl.[7] ............................... H01J 37/09
(52) U.S. Cl. .................. 250/492.23; 250/492.22; 250/505.1; 430/5; 430/296
(58) Field of Search ............... 250/492.23, 492.22, 250/492.2, 505.1; 430/5, 296

(56) References Cited

U.S. PATENT DOCUMENTS 5,674,413 A * 10/1997 Pfeiffer et al. .............. 430/5
6,140,020 A * 10/2000 Cummings ............ 250/492.2

* cited by examiner

Primary Examiner—Jack Berman
(74) Attorney, Agent, or Firm—Whitham, Curtis & Christofferson, P.C.

(57) ABSTRACT

Proximity (exposure dose) effects and/or local Coulomb (space charge defocussing) effects, both dependent on local pattern density of exposed areas, are simultaneously compensated in a charged particle beam projection device or tool by a projection reticle having an apertured weakly scattering membrane with selective strongly scattering regions between the apertures in the membrane. A reticle so constructed provides at least three independent exposure dosage levels that can be mixed to provide a wide range of exposure levels with high contrast. The more weakly the electrons are scattered (in the extreme, the electrons are not scattered at all through apertures), the greater the number that pass through a given beam contrast aperture, the higher the corresponding dose received at the target plane and the more space charge is contained in the beam bundle. Therefore, to compensate for the proximity effect (i.e. provide dose boost) and the local Coulomb effect (i.e. provide additional space charge) regions with reduced scattering characteristics are employed. Use of a hybrid doped resist allows exposure corresponding to an intermediate exposure dose in a preferred variant implementation exploiting the three dosage levels developed.

30 Claims, 9 Drawing Sheets

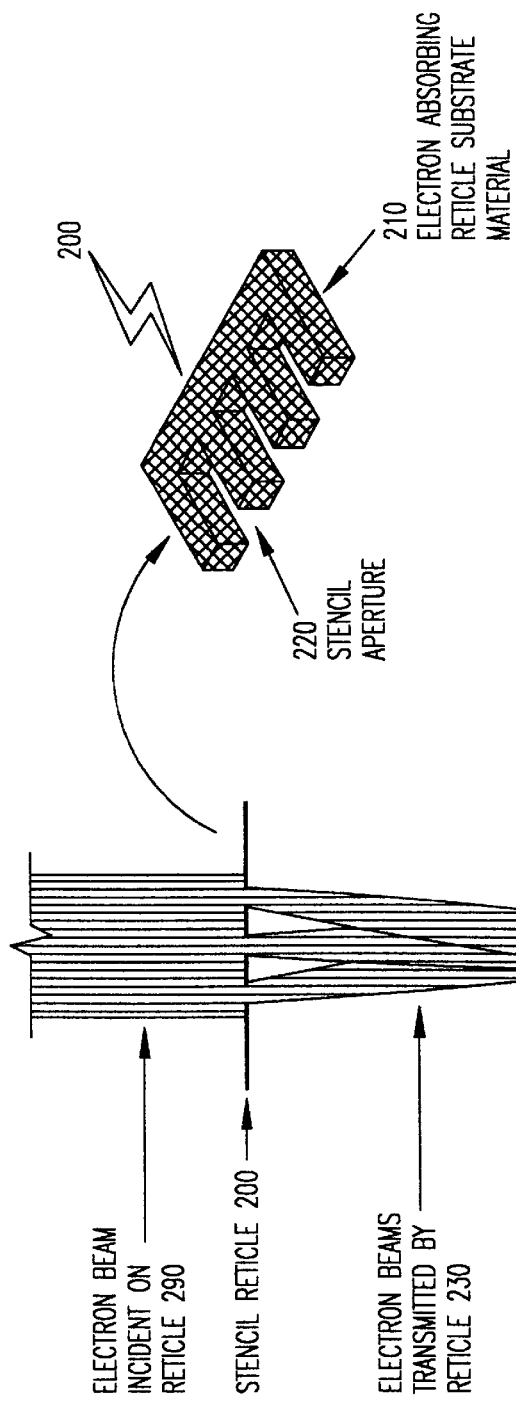
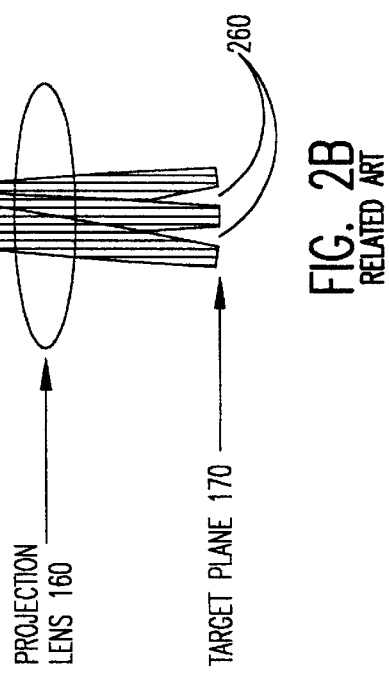
FIG. 2A RELATED ART
FIG. 2B RELATED ART

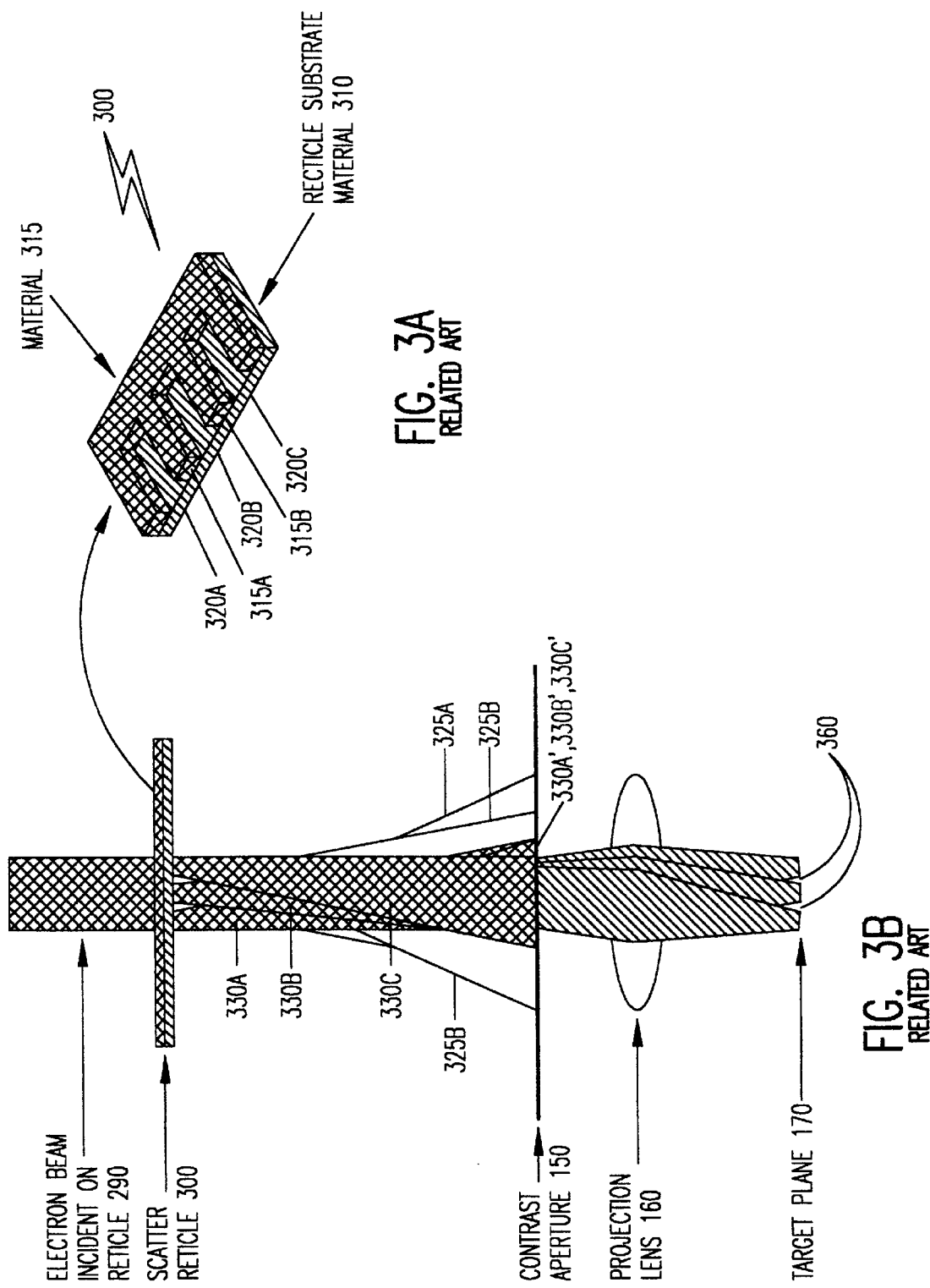

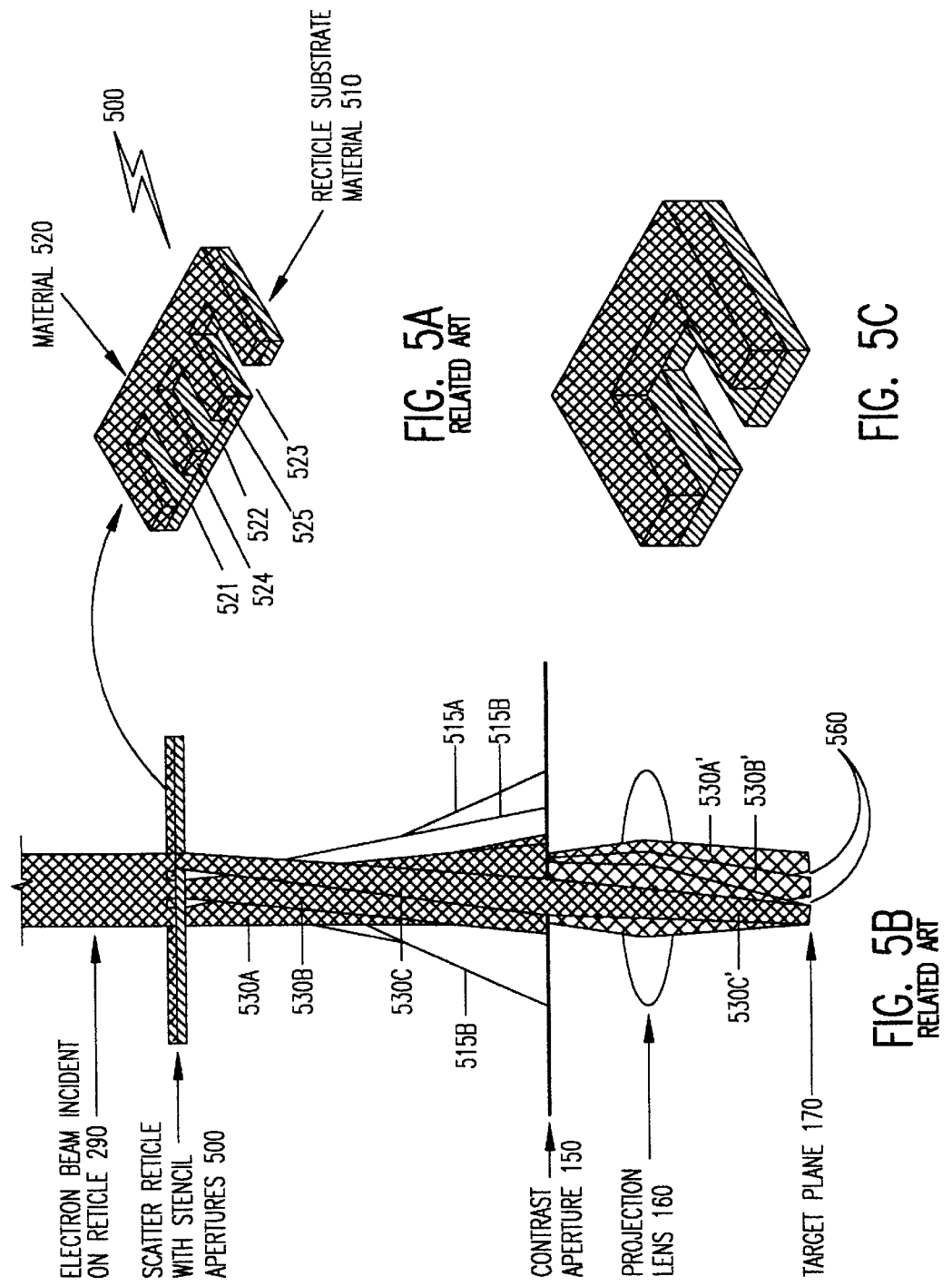

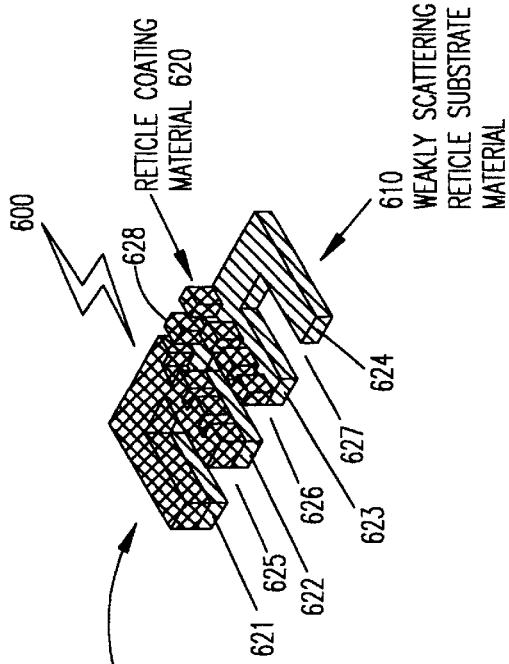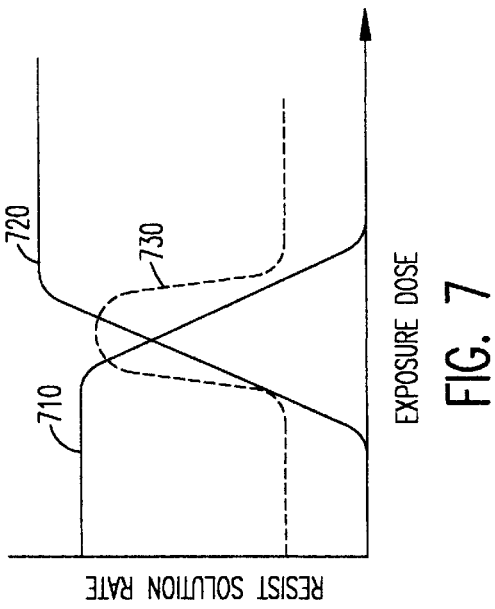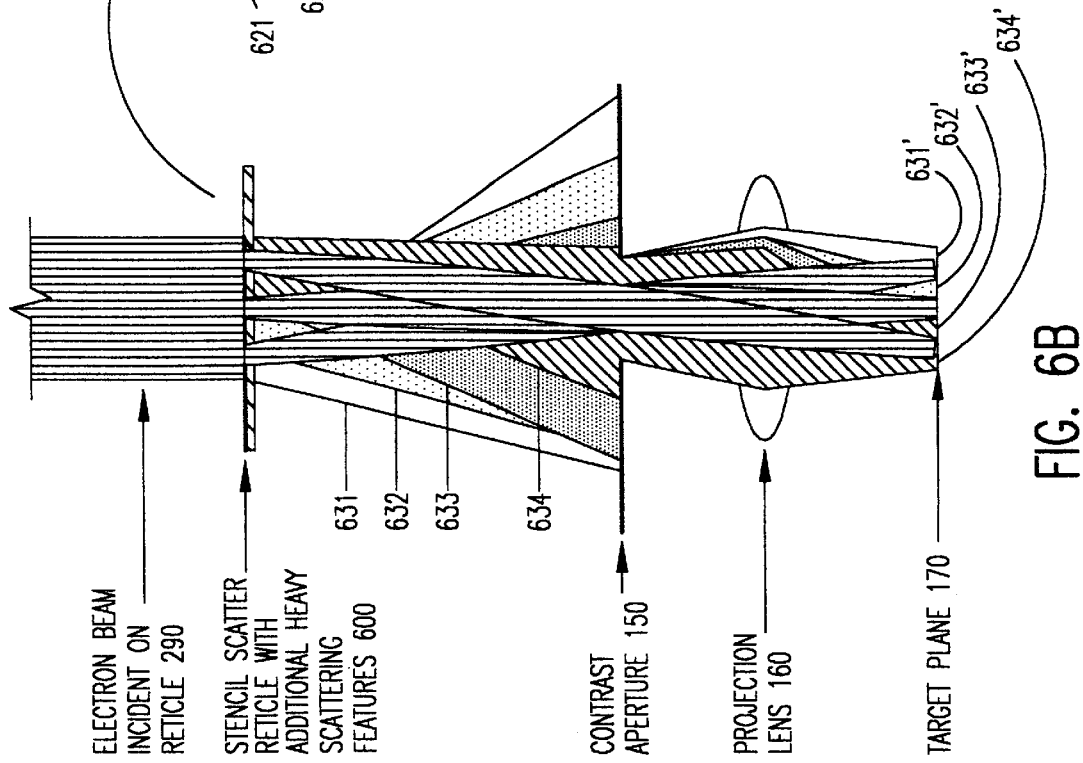

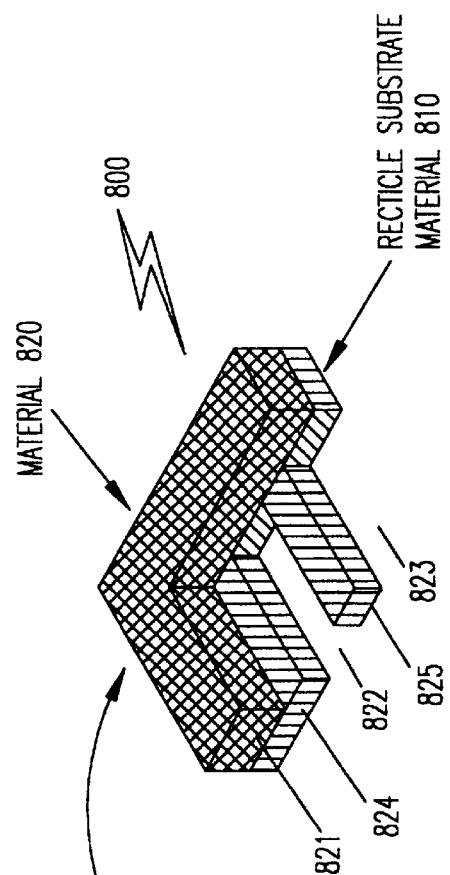
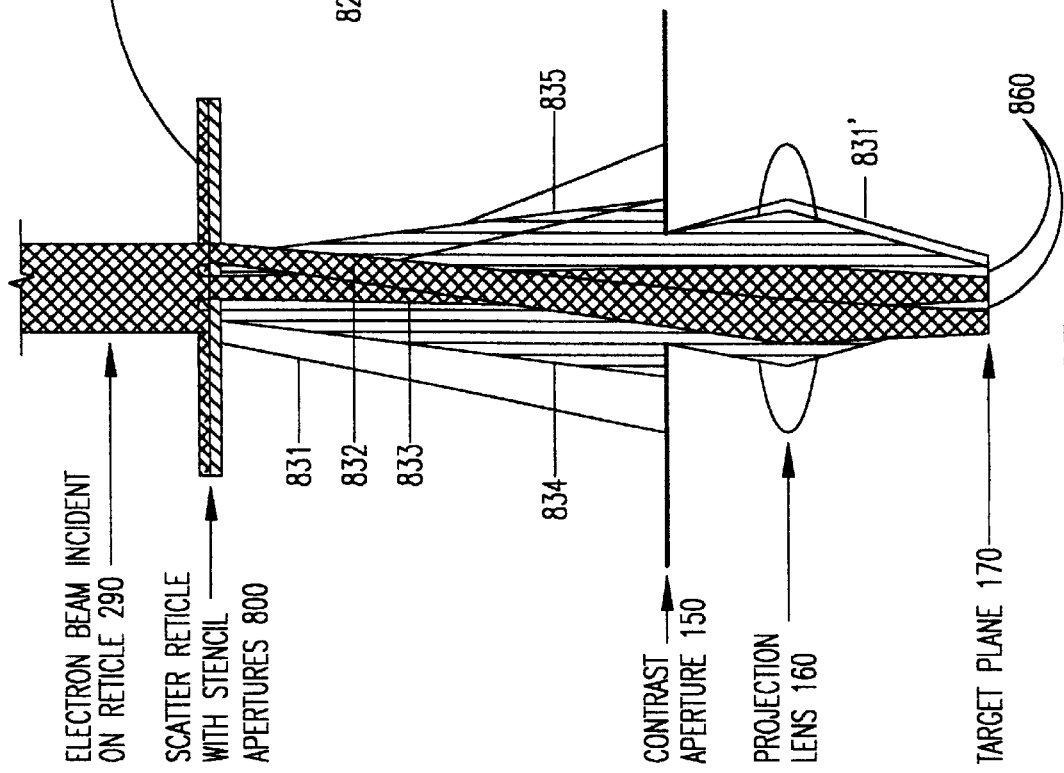

LITHOGRAPHY STEP

STENCIL RETICLE INCORPORATING SCATTERING FEATURES FOR ELECTRON BEAM PROJECTION LITHOGRAPHY

BACKGROUND OF THE INVENTION

1. Field of the Invention

The present invention generally relates to charged particle beam optical systems and, more particularly, to enhancement of exposures made by projection of a reticle pattern onto a target.

2. Description of the Prior Art

Numerous lithography techniques are known and are in widespread use for manufacture of integrated circuit devices, in particular. Essentially, such lithography processes define potentially very minute areas and shapes on a surface through selective exposure and removal of portions of a layer of resist to expose areas of the surface for further processing by, for example, etching, implantation and/or deposition. Exposure has generally been accomplished in the past by use of radiant energy such as visible wavelength light.

There is a strong incentive in the manufacture of integrated circuits to increase integration density to the greatest possible degree consistent with acceptable manufacturing yields. Device arrays of increased density provide increased performance since signal propagation time is reduced with reduced connection length and capacitance.

To form feature sizes in accordance with design rules incorporating sub-one-tenth micron regimes and below, it has been necessary to perform resist exposures with charged particle beams. Electron beams (e-beams) are favored since particles of the low mass of an electron can be more readily manipulated (e.g. accelerated, focused, guided and the like) at lower power levels preferably using magnetic lenses, correctors, deflectors and the like. Accordingly, while the invention will be discussed below in connection with an electron beam tool, it is to be understood that all such references are intended to be inclusive of tools using ions (e.g. of any element) or electrons. By the same token, the principles discussed herein are also applicable to other charged particle beam devices for purposes other than lithography or semiconductor device manufacture. Thus, references to an e-beam tool should be understood as inclusive of such other charged particle beam devices.

Early electron beam exposure tools were generally of the so-called "probe forming" type and were capable of exposing only a single spot or a relatively small number of pixels at a time. As chip complexity has increased, the throughput of such tools has become generally prohibitive for production of even modest numbers of a moderately complex integrated circuit design of high integration density. Accordingly, electron beam projection tools capable of concurrent exposure of hundreds of thousands to several millions of pixels have been developed.

At the same time, however, problems in projection fidelity and image quality not previously recognized or considered to be of practical importance have become critical to high manufacturing yields of high integration density chips, particularly as minimum feature size has been extended into regimes below one-tenth micron. Many of these problems are inherent in the electron beam optics in regard to proper abutment of sub-fields and aberrations which may be difficult to avoid. Other problems accrue from the complex dynamics of the beam of charged particles, itself, and the interaction of the beam with a target and/or the reticle.

One of the latter type of problems is referred to as the Proximity Effect. This effect derives from the fact that the material to be exposed is generally a resist coating on a target, such as a wafer. Electrons reaching the target wafer through the resist are backscattered with a distribution of trajectories which varies as the cosine of the angle of the backscattering trajectory relative to the incident beam. These backscattered electrons will also cause exposure of the resist.

In broad areas of resist to be exposed, the additional over-exposure will be of little practical effect when the backscattering occurs into regions which are also exposed. However, the exposure caused by backscattered particles contributes to the exposure dose which must be adjusted to avoid "blooming" at the edges of wide areas. This effect and the corresponding potential exposure artifacts are substantially more pronounced in areas of high pattern density (corresponding to closely spaced transparent areas on the reticle) where the spatial frequency of edges is greater and there is a greater likelihood of particles being backscattered into regions which are not intended to be exposed. Since the electron backscatter range is on the order of tens of microns for high energy (e.g. 50–100 keV) electron beams, the net effect of the proximity effect on sub-micron line and space features is an overall background dose boost if the features are located in a portion of the designed field with numerous neighboring features, referred to as high pattern density. Thus compensation appropriate to such regions may require a substantial reduction in direct exposure (e.g. of incident particles before backscattering by the target) dose to prevent overexposure relative to areas of lower pattern density.

However, in extremely large-scale integrated circuits in which a wide variety of circuits of differing functionalities are formed, it is to be expected that the pattern density will also vary widely. Thus the net result of the proximity effect, when the dose is adjusted to obtain suitable exposure of high pattern density areas, is to substantially underexpose areas of low pattern density (corresponding to relatively isolated transparent features on the reticle).

Another effect that potentially limits projection fidelity is referred to as the Local Coulomb Effect (LCE). Equally charged particles are mutually repelled by each other and this effect is cumulative, the net defocus varies with the local density of equally charged particles in the beam. Since the beam is patterned by the reticle in electron beam projection tools, in portions of each sub-field that correspond to a higher percentage of exposed area, electrons will experience a greater degree of mutual repulsion in the beam. This mutual repulsion is manifested in the manner of a plurality of small local (space charge) lenses. The complexity and magnitude of the effect and corresponding exposure artifacts are increased in charged particle beam projection systems because of the relatively large area (e.g. ¼ mm to 1 mm square) sub-field exposure area and the complexity of the pattern therein.

Higher percentages of exposed area correspond to both large exposed areas and areas of high pattern density. The net effect is one of local defocussing the beam and variation of the focal plane with percentage of exposed area in the pattern, causing variable blurring of portions of the image. In contrast with the proximity effect which locally affects exposure dose, the local Coulomb effect locally affects focus.

Three types of reticle mask are now in general use: a stencil mask, a so-called scattering mask and a stencil/scattering mask which combines operating principles of both the stencil mask and the scattering mask. The latter two of these types of reticle or mask develop significant populations of scattered particles and rely on use of a contrast aperture/mask to block particles having trajectories which do not correspond to the intended exposure pattern defined by the mask or reticle. The only scattering produced by a stencil mask is a result of non-vertical slope of stencil walls.

Specifically, in a stencil mask, a metallic foil of a thickness sufficient to absorb electrons of the energy level chosen for the exposure, is locally perforated. Electrons impinging on the remaining metallic portions of the mask are thus principally absorbed. Electrons passing through apertures are not absorbed or scattered. This type of mask is not generally favored since the high degree of absorption of charged particles and corresponding current causes heating and mask distortion.

In a so-called scattering mask, the mask membrane is very much thinner than in the stencil mask and generally formed of silicon nitride. The pattern is formed as a pattern of material of higher atomic number such as a metal which is much more strongly scattering of electrons than the very thin layer of silicon nitride. contrast is developed by use of a contrast aperture which differentially intercepts strongly and weakly scattered electrons.

The third type of reticle or mask is constructed similarly to the stencil mask, having apertures in a membrane and without strongly scattering material deposited thereon, but operates much in the manner of a scattering mask. To reduce particle absorption and heating of the reticle, the thickness of the mask membrane is adjusted in accordance with the particle energy so that absorption is avoided, but transmitted electrons are scattered significantly due to interactions with the mask material. Electrons passing through apertures are not absorbed or scattered. Again, as with scattering masks, the pattern is developed by a contrast aperture which intercepts the predominant portion of scattered particles.

It can be appreciated that each of these types of masks or reticles is intended to produce either full exposure or no (significant) exposure. Therefore, efforts to compensate for the proximity effect such as edge or feature size adjustment (by "trimming" of the reticle features), multiple exposures (e.g. illuminating the reticle with differently patterned beams), "ghost" corrections (using scattered electrons to provide background dose boost), dose modulation (standard in probe-forming systems but inapplicable to projection systems) and the like greatly increase complexity of the exposure process and potentially compromise the success of the process because they inherently involve the accuracy of respective portions of the reticle, may not be controllable enough at a local level, reduce system throughput and/or require registration of plural exposures. Compensation for local Coulomb effect would require regulation of percentage area of exposure in the circuit design which is not at all practical and, even if possible, would unacceptably constrain integrated circuit layout designers. Accordingly, it can be seen that, at the present state of the art, addressing the proximity and local Coulomb effects necessitates undesirable economic tradeoffs.

SUMMARY OF THE INVENTION

It is therefore an object of the present invention to provide a technique for simultaneous compensation of proximity effect and local Coulomb effect without imposing restrictions or complications on integrated circuit layout design.

It is another object of the present invention to provide a novel type of electron beam projection reticle having improved performance, particularly in regard to reduction of proximity effect and local Coulomb effect.

It is a further object of the present invention to provide an electron beam projection reticle capable of three independent levels of exposure dose which can be patterned without design restrictions.

It is yet another object of the present invention to provide significantly improved fidelity of charged particle beam projection exposures with elimination or substantial reduction of dose variation and local defocussing artifacts.

In order to accomplish these and other objects of the invention, a charged particle projection reticle is provided including an weakly scattering apertured membrane and strongly scattering deposits between the apertures in the weakly scattering membrane that, in combination with a contrast aperture provides at least three levels of exposure dose; simultaneously including adjustable proximity effect correction boost and local Coulomb effect correction.

In accordance with another aspect of the invention, a method of performing charged particle beam projection lithography and method of semiconductor device manufacture are provided including the steps of distributing strongly scattering deposits on a weakly scattering reticle membrane and projecting a beam of charged particles through said reticle and a contrast aperture onto a target whereby at least three levels of charged particle flux are developed to approximately compensate proximity effect and local Coulomb effect simultaneously.

BRIEF DESCRIPTION OF THE DRAWINGS

The foregoing and other objects, aspects and advantages will be better understood from the following detailed description of a preferred embodiment of the invention with reference to the drawings, in which:

FIGS. 2A and 2B are a schematic depiction of a stencil mask and its operation;

FIGS. 3A and 3B are a schematic depiction of a scattering mask and its operation;

FIGS. 5A, 5B and 5C are a schematic depiction of a reticle or mask in accordance with the invention and its operation;

FIGS. 6A and 6B are a schematic depiction of a reticle or mask in accordance with a preferred form of the invention and its operation;

FIG. 7 is a graph of resist dissolution as a function of exposure dose for a hybrid resist;

FIGS. 8A and 8B are a schematic depiction of a reticle or mask in accordance with a preferred variant form of the invention and its operation.

DETAILED DESCRIPTION OF A PREFERRED EMBODIMENT OF THE INVENTION

Figure 1:
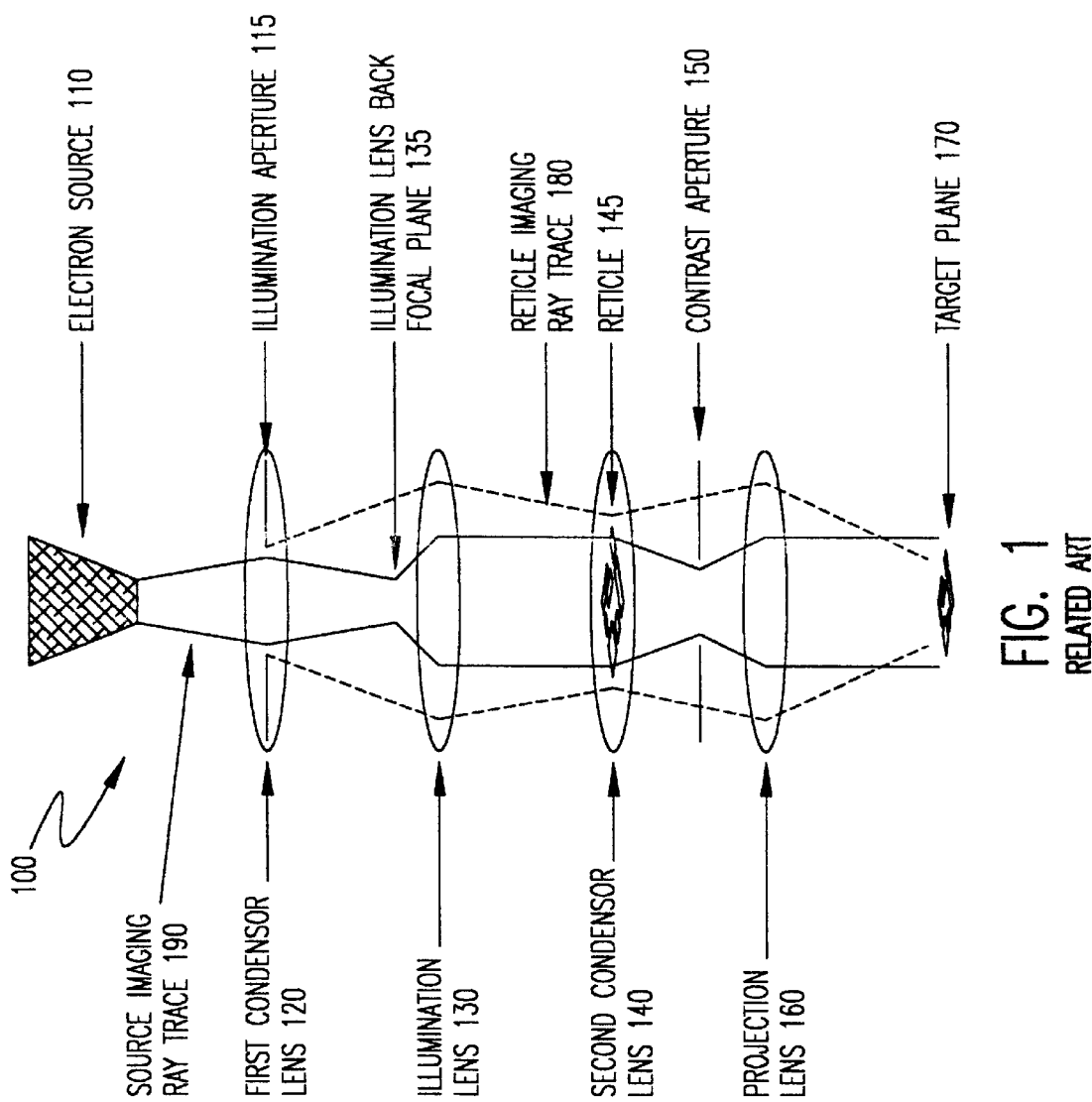
FIG. 1 is a highly schematic and simplified perspective illustration of the major elements of a particle beam projection tool.

Referring now to the drawings, and more particularly to FIG. 1, there is shown, in highly schematic and much simplified form, the major elements of an electron beam projection system 100. In FIG. 1, as in other Figures, structures and functions are depicted in a manner considered most useful in conveying an understanding of the invention. The term "known" is used to refer to that over which the present invention provides an improvement but is specifically not intended as an admission of prior art in regard to the present invention. It should also be understood that the basic principles of the invention are grounded in the enhancement and exploitation of a combination of effects largely unrecognized and unexploited, even singly, in known reticles and which are best explained in connection with structures considered "known". Accordingly, FIGS. 1–4B are denoted as "Related Art" in order to accurately reflect their connection with and relevance to the present invention, including the aspects of the present invention explained with reference thereto.

For example, with reference to FIG. 1, the inclusion of a reticle 145 and contrast aperture 150 are common parts of an electron beam projection system or tool. However, it is to be understood that the reticle 145 depicted in FIG. 1 could be considered as depicting the gross features of the reticle in accordance with the invention although it is principally intended to illustrate that the employment and positioning of the reticle in accordance with the invention is unchanged from known systems. Accordingly, no portion of FIGS. 1–4B is admitted to be prior art as to the present invention.

Specifically, as shown in FIG. 1, the charged particle beam (hereinafter referred to as "e-beam" to reflect the preferred implementation of the invention) tool provides an electron (or ion) source 110 of a design with should provide uniform illumination over a substantial area corresponding to the sub-field size at the reticle but which is otherwise unimportant to the practice of the invention. Similarly, the illumination aperture 115 is suitably dimensioned to intercept portions of the beam of reduced intensity or which is otherwise unusable relative to the sub-field of the reticle.

A source imaging ray trace is depicted by dotted lines 190 of FIG. 1. A first condenser lens 120 focusses the electron source (cathode crossover) 110 to the back focal plane 135 of the illumination lens 130 which ultimately ensures parallel and uniform illumination of the reticle 145. A second condensor lens 140 further images the source to the contrast aperture 150 plane. As the contrast aperture 150 is located at the back focal plane (sometimes referred to as the "front focal plane", depending on convention) of the projection lens 160, the illumination at the target plane 170 is likewise ensured to be parallel and uniform. Referring now to dashed lines 180 of FIG. 1, note the imaging of the illumination aperture 115 to the reticle plane by the illumination lens 130 and of the reticle 145 to the target plane 170 by the projection lens 160. The simultaneous imaging of the source 110 to the back focal plane (at contrast aperture 150) of the projector lens 160 and imaging of the reticle 145 to the target plane 170 is characteristic of critical Kohler illumination.

Illumination of a selected sub-field is preferably accomplished by deflection in accordance with a curvilinear axis trajectory but other deflection schemes and translation of the reticle perpendicular to the tool electron-optical axis are also suitable for the practice of the invention. The reticle 145 thus provides a shaped beam in accordance with the pattern in the reticle while, depending on the nature of the reticle, particles scattered therefrom are intercepted by contrast aperture 150.

It should be understood that this general configuration and operation thereof is common to many e-beam tools, regardless of the nature of the reticle. The only major variation therein will be in regard to the function or functions of the contrast aperture 150. Of course, there will be some variation in operation because of the type of lenses used (e.g. symmetric doublets), optimization of axial location of optical elements and correctors of various sorts (e.g. stigmators, correction lenses for thermal effects and the like). However, these latter variations are of no importance to the practice of the invention. The function of the contrast aperture in regard to the reticle in accordance with the present invention will become apparent from the following discussion of FIGS. 2A–8B.

FIG. 2A illustrates a stencil reticle 200 having a very much simplified pattern formed therein relative to a sub-field pattern for an integrated circuit. Essentially, a stencil reticle or mask 200 comprises a relatively thick foil 210 having apertures 220 formed therein. The thickness is chosen to be sufficient, relative to the energy of electrons in the incident e-beam 290, to absorb virtually all electrons incident thereon. Electrons passing through apertures 220 are substantially unaffected and shaped beams 230 of FIG. 2B are formed.

The shaped beams 230 are focussed by projection lens 160 to ideally form a demagnified image of the reticle 200 at target plane 170. Since electrons incident on stencil reticle 200 are substantially absorbed, very few, if any, electrons will exist in regions 260 and at the target plane 170. However, as discussed above, this image is subject to proximity (dose) and local Coulomb (defocussing) effects not shown in FIG. 2B in the interest of clarity.

A scattering type mask 300 is shown in FIG. 3A and comprises a very thin continuous membrane 310 which, by virtue of its thinness and low atomic number, has a very weak scattering effect on electrons passing therethrough. The reticle pattern is formed by a layer 315 of higher atomic number material such as a metal which exhibits a strong scattering effect on electrons incident thereon and having apertures 320a–320c therein. Therefore, with reference to FIG. 3B, electrons incident on regions 315a and 315b of layer 315 will be strongly scattered through relatively large solid angles indicated by 325a and 325b, respectively. Electrons passing through apertures 320a, 320b and 320c in layer 315 are much more weakly scattered through much smaller solid angles 330a, 330b and 330c, respectively.

It should be recognized that these smaller solid angles are generally within the solid angles of the trajectories of more strongly scattered electrons such that some electrons scattered by layer 315 will nevertheless have trajectories which are not greatly altered and, further, due to the weak scattering of layer 310, shaped beams 330a–330c cannot be entirely well-focussed. Accordingly, the image of the scattering reticle is largely developed by use of contrast aperture 150 (and projection lens 160) which differentially intercepts the strongly and weakly scattered electrons and also the fringes (e.g. 330a', 330b', 330c') of the more weakly scattered portions of the beam such that an exposure of the resist is made with sufficient contrast (e.g. differential dosages) to ideally provide the desired image upon development. However, as discussed above, the image will nevertheless be degraded by proximity and local Coulomb effects.

It should be noted that interception of fringes 330a', 330b', 330c' also reduces the electron flux reaching the target from the reticle; requiring greater initial beam current or longer exposure with smaller contrast apertures. Therefore, for a given membrane 310 thickness, there is a trade-off between image quality and throughput within the requirement of using a sufficiently small aperture to develop sufficient contrast relative to the exposure characteristics of the resist.

The inventors have also recognized that while the electron density in the larger solid angles of trajectories of electrons strongly scattered by layer 315 will be much reduced, some population of such electrons will contribute to the image. Along with electrons backscattered from the target substrate (proximity effect) these contribute a background dose in regions 360 of the target plane 170. This background dose degrades the exposure contrast, but the use of high contrast resists (i.e. highly non-linear in rate of development and dissolution as a function of exposure dose) can mitigate this effect. That is, the differential dosage between intended and non-intended exposure areas need only be sufficient to be accommodated and differentially developed by the high contrast resist.

Nevertheless, it is considered important to an understanding of the principles of the invention to realize that, while the dose in region 360 is effectively and practically negligible, it is nevertheless theoretically greater (and of somewhat different origin) than in regions 260 of FIG. 2. This effect will be seen to be of increased importance in consideration of the scattering-stencil type of reticle illustrated in FIGS. 4A and 4B.

In the following discussion of FIGS. 4A and 4B, a distinction should be appreciated between the inherent strength of scattering of particular materials, generally proportional to atomic number, and the actual degree of scattering which will be produced by the thickness of any given material through which the electrons pass as well as the atomic number of the material. That is, particularly for materials which are inherently "weakly" scattering, the actual degree or "strength" of scattering will be roughly proportional to the thickness of a layer or membrane of the weakly scattering material (below a thickness which causes absorption of the predominant portion of the incident particles). By the same token, the "strength" of scattering by a strongly scattering material will be affected by thickness of a layer thereof and an extremely thin layer of a strongly scattering material will produce relatively weak scattering (e.g. comparable to a greater thickness of a weakly scattering material).

Thus, the solid angles of scattering depicted in FIGS. 3A, 3B–6A, 6B and 8A, 8B should be understood as the angles corresponding to the inclusion of some statistical proportion of the particle flux and that there will be a statistical variation of flux density within the solid angle depicted. Nevertheless, the size of the solid angles is approximately inversely proportional to the flux which has trajectories that will pass through an aperture of a given area and subtending a given angle at a given distance from the reticle.

Figures 4A, 4B:
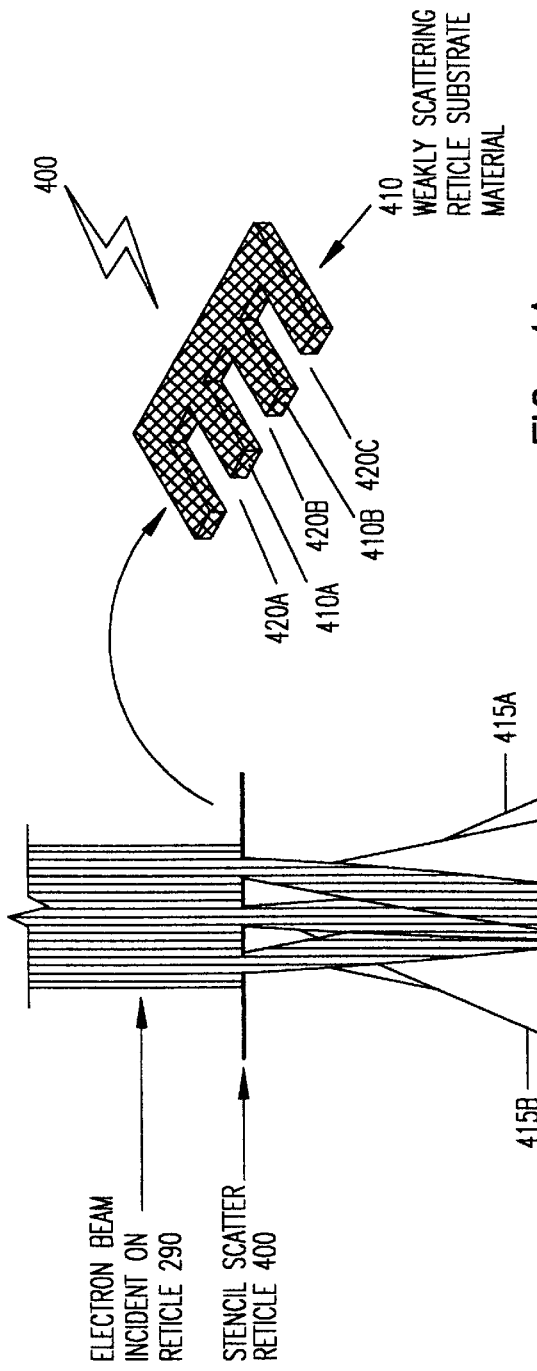
FIGS. 4A and 4B are a schematic depiction of a stencil-scattering mask and its operation.

As alluded to above, the reticle 400 of the scattering-stencil reticle of FIG. 4A comprises a layer 410 of weakly scattering material such as silicon or silicon nitride having apertures 420a, 420b and 420c therein. The thickness of layer 410 is generally chosen to be much less than that of layer 210 in FIG. 2A to greatly increase the transmission of electrons while much thicker than membrane 310 of FIG. 3A since electrons passing therethrough are not, in contrast with the operation of the mask of FIG. 3A and function illustrated in FIG. 3B, intended to contribute to the image.

For example, if the membrane thickness 410 is set to two microns (an order of magnitude thicker than the membrane 310 of the scattering reticle) then the solid angles 415a, 415b of scattering provided by membrane regions 410a, 410b, respectively, are comparable, as depicted by solid angles 325a, 325b to scattering provided by the weakly scattering reticle membrane 310 (e.g.<0.2 microns) plus the strongly scattering reticle coating material 315 (e.g. <0.1 microns). The solid angles 415a, 415b can be manipulated at will by the thickness of the membrane 410. As in the stencil mask of FIG. 2A, the electrons passing through apertures 420a–420c are not significantly affected and form a strong image at the target plane 170 with the contrast enhanced by contrast aperture 150.

It should be understood that the contrast will be enhanced if the contrast aperture is small as indicated at 430 to limit the amount of exposure contribution from the scattered electrons relative to the solid angle of scattering produced by the membrane 410. However, the inventors have discovered that if the contrast aperture is sized in accordance with the general considerations alluded to above for the scattering mask and operation thereof as shown in FIGS. 3A and 3B, the background dose can be usefully regulated by a combination of the thickness of membrane 410 (which is preferably and conveniently uniform but could, in theory, be varied) in combination with a selectively applied additional thickness of strongly scattering material. The inventors have also discovered that the background dose, while effectively negligible for high contrast resists and at levels provided by scattering masks as currently employed, represents additional space charge which can mitigate local Coulomb effect and compensate for it in a substantially complete manner in accordance with a preferred form of the invention.

The reticle or mask in accordance with the invention will now be explained in connection with FIGS. 5A and 5B. As with the scattering mask of FIG. 3A, a layer of weakly scattering material 510 is provided. Also, as in the reticle of FIG. 3A, a layer of strongly scattering material 520 having apertures therein is provided. However, in contrast with the reticle of FIG. 3A, apertures are also selectively provided in the weakly scattering material, much in the manner of the reticle of FIG. 2A or, more appropriately, FIG. 4A. Conversely viewed, the mask of FIG. 5A may be considered as similar to the scattering-stencil mask of FIG. 4A with additional scattering features of strongly scattering material deposited thereon.

As shown in FIG. 5B, the portion of the beam transmitting apertures 521 and 522 are "weakly" scattered as shown by beam portions 530a and 530b. It is very important to appreciate that the solid angle of these beam portions can be varied by varying the thickness of layer 510, as will be discussed below. The portions of the beam incident on portions 524, 525 of strongly scattering layer 520 are more strongly scattered through a larger solid angle as depicted by 515a and 515b, respectively. Thus, beam portions 530a and 530b, after being partially intercepted by contrast aperture 150 form imaging beams 530a', –530b' and are focussed at the target plane, (subject to proximity and local Coulomb effects).

The portion 530c of the beam transmitting aperture 523, however, is substantially unaffected by the reticle and is more intensely imaged at the target plane since no portion of the beam portion is intercepted by the contrast aperture 150. Note that no fringe corresponding to fringe 330c' of FIG. 3 is present in FIG. 5.

Additionally a small background flux contribution is provided in nominally unexposed regions 560 at the target plane from areas (e.g. 524, 525) of strongly scattering material which can be considered as "strongly scattering features". That is, three flux levels of effectively maximum flux, substantially zero flux (e.g. non-zero but arbitrarily low, depending upon the contrast aperture) and a controllable intermediate level where the flux is dependent upon the degree of scattering (which is determined by the thickness of layer 510) relative to the size of the contrast aperture 150.

This third flux level, together with the background flux can be exploited in various ways in accordance with the invention particularly to correct for local Coulomb effect concurrently with correction of proximity (dose) effects.

For example, in regions of high pattern density or large exposed areas, lithographic features would be defined only in the strongly scattering layer 520 and in regions where the pattern density is low, the lithographic features would be defined equally in both scattering layers 510 and 520, providing the maximum dose boost. Since the primary beam current is increased, this will also help to compensate for the reduced space charge that otherwise results in reduced local Coulomb effect. In regions of intermediate pattern density, an intermediate dose boost and space charge compensation would be provided by defining the lithographic feature entirely in the strongly scattering layer 520 and partially in the weakly scattering layer 510 as in FIG. 5C. If, for example, the contrast aperture and the thickness of layers 510 and 520 were chosen such that the nominal electron dose imaged to the target plane 170 was 50% for layer 510, 10% for the combination of layers 510 and 520 and 100% for an aperture, then any dose from 50% to 100% could be obtained by proper sizing of the openings in layer 510 with a contrast ratio of at least 5:1 (50%:10%).

Specifically, the particular mask design shown in FIG. 5A is not generally preferred for practice of the invention since it seeks to define exposure areas by apertures in layer 520. The reticle of FIG. 5A is, however, illustrative of the fact that a third dosage or contrast level can be developed and the relative flux thereof arbitrarily chosen as a correction for proximity effect in accordance with the invention. However, this configuration would not provide more than incidental levels of compensation of local Coulomb effect by the additional space charge contribution from maximum flux reticle areas.

Consider, now, a mask or reticle consistent with FIG. 5A but defining the features to be exposed by apertures in the reticle substrate material 510 similar to the scattering-stencil mask similar to FIG. 4A but with "scattering features" of strongly scattering material deposited in some areas thereon, an exemplary portion 600 of which is shown in FIG. 6. The features to be exposed are defined principally by apertures 625, 626 and 627 (and also, potentially, by portions of a layer of strongly scattering material 620).

Returning briefly to FIG. 3B, it will be appreciated that the weakly scattered particles will contribute more to the background exposure dose than the strongly scattered particles, while the proportion of strongly scattered to weakly scattered particles will be proportional to the areas covered with strongly scattering material. Similarly, the relative dosage boost will be controlled by the degree of scattering by the bare layer 610 and the size of the contrast aperture 150 diminishing the flux of the beam portions traversing layer 610, compared to the degree of scattering by the coating material 620 and the size of the contrast aperture 150 diminishing the flux of the beam portions traversing both layers 610 and 620. The relative amount of bare or metallized area of weakly scattering membrane can be set to compensate for relative proximity effect boost. Where strongly scattering material is not deposited, the weakly scattered background flux (which is controllably stronger than the strongly scattered background flux) provides the dose boost in exposed areas to correct for proximity effect while potentially providing increased background space charge to compensate for local Coulomb effect and while the flux is below the dose sufficient to expose a high gamma (contrast) resist in masked areas.

Specifically, in regions of high pattern density or relatively high proportion of exposed areas, lithographic features would be defined as in 625 in both the strongly scattering layer 620 and the weakly scattering membrane 610. In regions where the pattern density was low, the lithographic features would be defined as in 627 only in the weakly scattering membrane 610 with no strongly scattering material nearby. Since the primary beam current is increased, this will also help to compensate for the reduced space charge that otherwise results in the local Coulomb effect. In regions of intermediate pattern density, an intermediate dose boost and space charge compensation would be provided by defining the lithographic features as in 626 entirely in the weakly scattering membrane 610 and incorporating an appropriate amount of strongly scattering material 620 distributed in regions on top of the membrane substrate, as generally shown at 628.

If, for example, the contrast aperture and the thickness of layers 610 and 620 were chosen such that the nominal electron dose imaged to the target plane 170 was 20% for layer 610, less than 1% for the combination of layers 610 and 620 and 100% in the case of an aperture, then essentially any dose from 100% to 120% of nominal could be obtained by properly distributing strongly scattering features with a contrast of at least 5:1 (100%:20%).

The third dosage/contrast level developed by the charged particle projection reticle of the invention can be advantageously exploited in other ways, as well, many of which will become apparent to those skilled in the art in view of the following example of a preferred variant form of the invention. It was noted above that the scattering type of mask (FIG. 3A) reduces intensity of exposure which requires increased initial beam current to maintain throughput and imposes a trade-off between exposure time and image quality. Image quality degrades at higher beam current due to the increased feature edge blur that results from the stochastic electron-electron interaction. Nevertheless, this type of reticle design has the advantage of being able to expose annular features (an exposed region with an unexposed region completely enclosed therein) which cannot be formed by a stencil mask.

In accordance with the invention, instead of using only a single high-gamma positive or negative resist (or mixture of positive resists or negative resists) a positive or negative resist can be doped with a negative or positive resist, respectively. Exemplary development/dissolution rate characteristics of negative and positive resists as a function of exposure are shown by curves 710, 720 in FIG. 7. When a positive resist is doped with a negative resist or vice-versa to form a hybrid resist, the dissolution rate during development assumes a sharp peak at an intermediate dosage level and falls off sharply at higher and lower dosages as shown by dashed line 730.

Therefore, the intermediate dose level provided by the reticle in accordance with the invention can image a pattern bounded by both apertures in a membrane and strongly scattering material as shown in FIG. 8. Now the bare membrane areas 824 and 825 define the pattern features to be fully exposed and the thin metal coating layer 820 defines the areas not to be exposed as with the conventional scattering reticle of FIG. 3. However, where dose boost and beam current increases are necessary to balance proximity and local Coulomb effects, features can be bordered by appropriately sized holes in the membrane. The dose achieved at target locations conjugate to such membrane holes is high enough such that the resist is insoluble in the developer but the subsidiary effects provide the necessary dose boost and balance the local Coulomb effect in the nearby soluble regions. Thus annular patterns can be formed with a reticle providing increased flexibility of design and while compensating for proximity and local Coulomb effects by appropriate choice of apertures or strongly scattering material adjacent to areas of bare weakly scattering material.

Figure 9A:
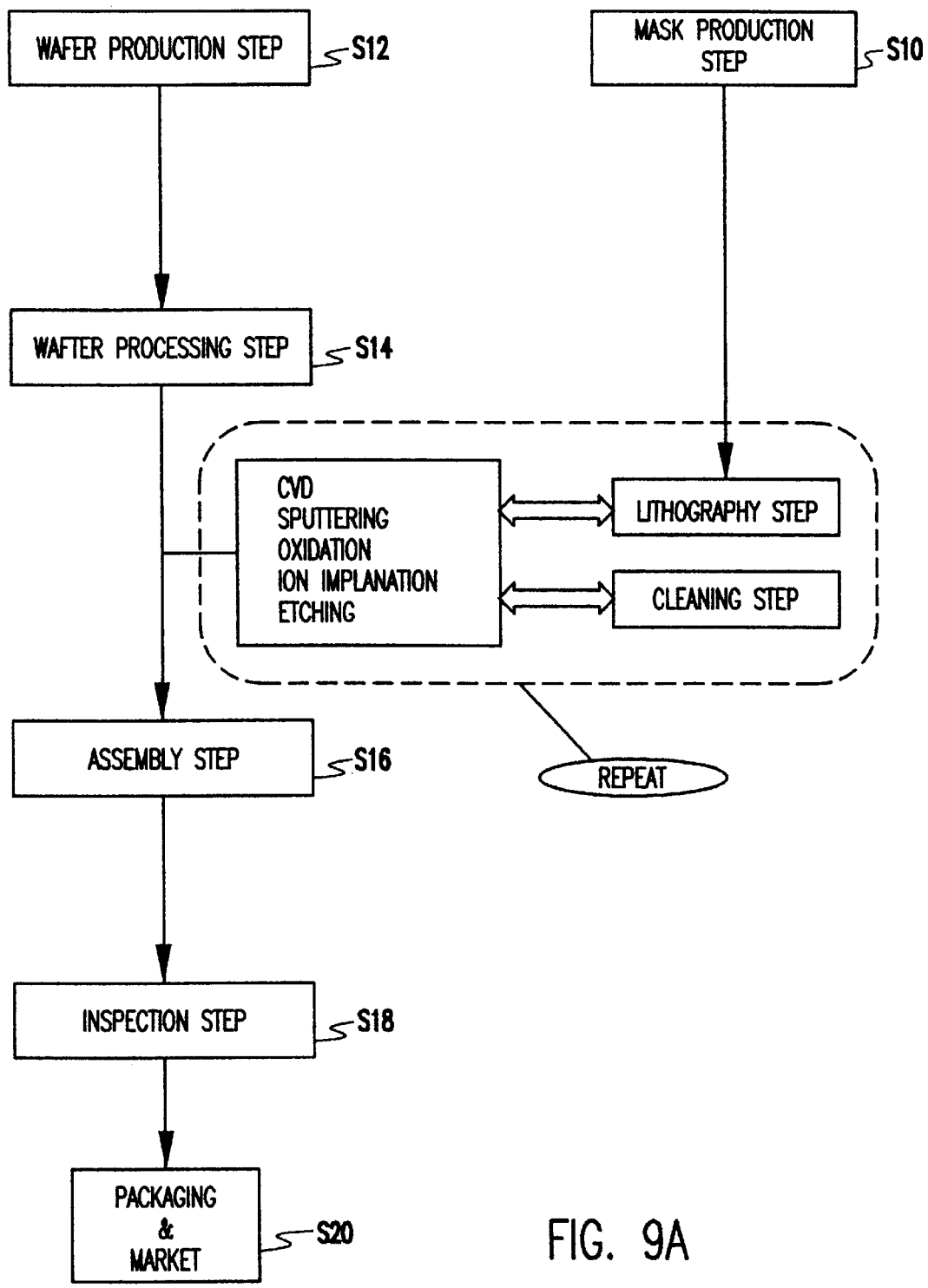
FIGS. 9A and 9B illustrate a generalized method of semiconductor manufacture utilizing the invention.

FIG. 9A shows a generalized flow diagram providing an overview of the fabrication process for a semiconductor device (or apparatus) utilizing the invention. It will be understood by one of ordinary skill in the art that FIG. 9A may equally represent a high level block diagram of a fabrication process of a semiconductor device. It is also well understood that the high level block diagram represents a preferred although generalized fabrication method and that other fabrication methods may be similarly used with the present invention. Details of particular fabrication methods are unimportant to the practice of the invention; however, at least one lithographic exposure is invariably required to determine device locations and dimensions. When the lithographic process is carried out in accordance with the invention described above, more accurately defined patterns can be achieved consistent with high throughput in manufacture of integrated circuits of increased functionality and improved performance, which are not otherwise produceable with other currently known lithographic techniques that do not include utilization of the invention.

Referring now to FIG. 9A, the semiconductor device fabrication begins with a mask fabrication at step S10. The mask fabrication comprises patterning a mask by known methods such as, for example, resist coating, electron beam exposure, development, etching, resist stripping and the like. In general, it is considered desirable to form one or more layers of weakly scattering material such as silicon oxide or nitride (e.g. deposited or grown), possibly including a very thin layer of more strongly scattering material, on a substrate of suitable material followed by a layer of strongly scattering material. The layer or layers should have somewhat greater thickness than the final thickness desired to provide particular solid angles of scattering. The substrate itself may be used as a weakly scattering material. The substrate is then etched away from the side opposite the deposited or grown layer(s) in sub-field areas to yield a desired membrane thickness between a grid of struts which enhance physical robustness of the reticle mask. The subfield areas can then be patterned by two or more lithographic processes using a resist and radiant energy or electron beam exposure. In general, it is preferable to pattern the strongly scattering material layer prior to the formation of apertures but the order of patterning of the respective layers and/or substrate material is not important to the practice of the invention.

Upon completion of the mask fabrication, the mask is inspected and corrections to the mask are made, if necessary. In order to correct any defects that may be present in the mask, the patterning of the mask would again be performed subsequent to inspection. The finished mask (or reticle) is then used for wafer processing at step S14.

Wafer fabrication typically comprises growing a single crystal and performing mechanical processes on the grown crystal. These mechanical processes may include, for example, slicing or cutting a wafer and rounding the edges. The wafer is then polished and well known thermal processing is performed thereon as may be desired, for example, to getter impurities and or contaminants, repair crystal damage or the like. Thereafter, the wafer is inspected for defects.

Once the wafer is fabricated and only a predetermined small amount of tolerable defects are found, wafer processing begins at step S14. Wafer processing includes providing a thin film on a wafer for providing a circuit element. The thin film may be formed on the wafer by, for example, evaporation or sputtering deposition, CVD (chemical vapor deposition), ion implantation and the like depending on the intended material of the film. Once the thin film is deposited on the wafer, modification of the thin film is performed in order to provide the thin film with certain defined electrical properties, if necessary. The modification of the thin film may include, for example, etching to form circuit patterns, oxidation to form an insulator or doping to control conductivity. Doping may be performed by any well known method such as ion implantation, thermal diffusion, deposition of a doped film and the like.

It is well understood by one skilled in the art that the wafer may be washed after the wafer process (e.g., etching, deposition, implantation and the like). It is also understood that several processing steps, such as, for example, two or more CVD processing steps or the like may be performed, and that the washing of the wafer may be performed between each of these individual processing steps, if desired. The washing and processing of the wafer may be repeated any number of times, and is limited only by the design and intended function of the finished device.

The thin film is patterned using the mask fabricated in step S10. The patterning of the thin film includes exposing the resist layer, via a lithographic process (e.g., charged particle exposure), to form a latent image on the resist. The charged particle exposure is discussed in detail with reference to FIG. 9B. It is further well understood that the charged particle exposure selectively modifies the resist in a predetermined pattern by altering the chemical composition of the resist in accordance with the effective dose in respective areas as deined by the mask or reticle. By use of the mask or reticle in accordance with the invention, the exposure dose provided to respective areas of the resist on the wafer may be controlled at will with high precision both as to dose and pattern accuracy regardless of complexity of the pattern and differences in pattern density over the sub-field. Variation of exposure dose from the ideal due to local Coulomb effect and proximity effect can be substantially or completely compensated, as discussed above.

The resist is then developed to form a pattern in accordance with the exposure and inspected for any defects. After inspection, the wafer is baked to stabilize the resist pattern, and after the desired processing (e.g., etching, deposition, implantation and the like), the resist may be stripped and the wafer washed, if necessary.

The charged particle exposure and subsequent processes performed in accordance with the developed resist pattern produced thereby, depicted in step S14 may be repeated any number of times in order to provide numerous thin film layers having certain defined electrical properties in patterned areas of each such layer. Moreover, the wafer may be washed after each individual charged particle exposure process. Depending on the specific application, the wafer may then be coated with an insulative layer and provided with a contact holes (e.g., through holes) to provide electrical connection to devices formed thereon.

In step S16, the patterned wafer is assembled into a device. This process includes testing, inspecting and dicing the wafer, and providing bonding to the chips diced from the wafer. Bonding includes connecting a lead wire for connection to an electrode, semiconductor device or other component. The assembled semiconductor chip is then packaged (e.g., sealed) to stabilize the semiconductor chip and inspected for any defects. In step S18, the assembled semiconductor chip is inspected and tested, and introduced into the marketplace in step S20.

Figure 9B:
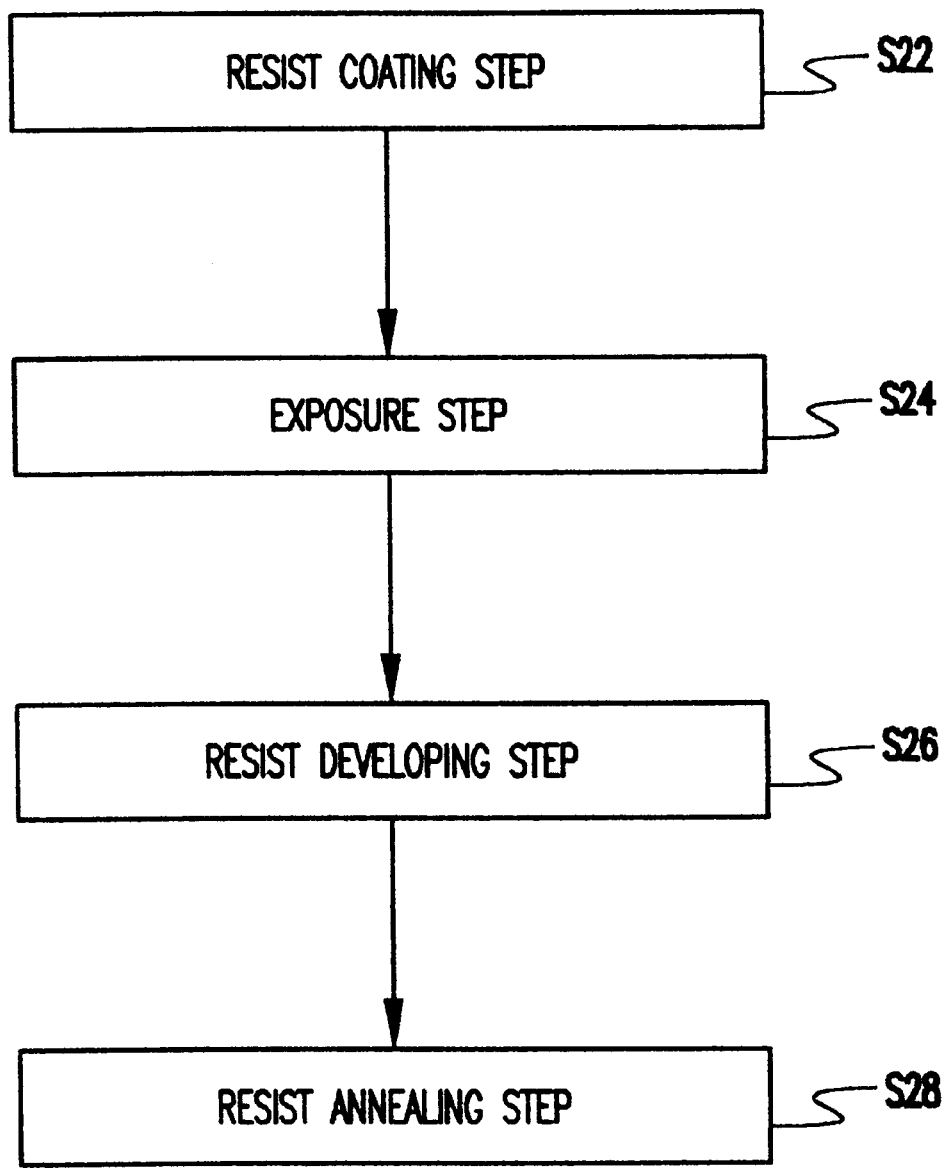

FIG. 9B shows the detailed process of resist pattern formation as shown with relation to the resist pattern formation of step S14 of FIG. 9A. As is well understood by those of ordinary skill in the art, the lithographic process of steps S22–S26 is invariably included to define latent images on the resist, and that the patterning of the resist is critical to the overall design of the device regardless of the technology that may be used to develop such latent images on the resist since the location and basic dimensions of electron elements and conductors are established thereby. To this end, at step S22, the step of resist coating is shown. At step S24, the resist is exposed to electron means utilizing the mask formed in step S10 of FIG. 9A. This exposure is performed, for example, by an electron beam stepper device. At step S26, the resist is developed to form a pattern in accordance with the exposure of step S24. At step S26, the resist is then annealed. Once such a pattern is formed, the semiconductor fabrication process continues as described above.

In view of the foregoing, it is seen that the reticle design in accordance with the invention provides for three independently controllable exposure dosage levels and simultaneous compensation of proximity and local Coulomb effects yielding exposure patterns of improved fidelity. The invention thus supports high manufacturing yield of integrated circuit devices of extremely high complexity and integration density while maintaining acceptable levels of throughput and without complicating device design or layout.

While the invention has been described in terms of a single preferred embodiment and variations thereon, those skilled in the art will recognize that the invention can be practiced with modification within the spirit and scope of the appended claims.

Having thus described my invention, what I claim as new and desire to secure by Letters Patent is as follows:

1. A charged particle projection reticle including
   a weakly scattering membrane having apertures therein, and
   strongly scattering regions between said apertures in said weakly scattering membrane.

2. A charged particle projection reticle as recited in claim 1, wherein an area of said strongly scattering regions between said apertures is proportioned in accordance with feature density.

3. A charged particle projection reticle as recited in claim 1, wherein a thickness of said weakly scattering membrane and a thickness of a strongly scattering region are determined in combination with a size of a contrast aperture to simultaneously adjust proximity effect correction dosage boost and local Coulomb effect space charge density.

4. A charged particle projection reticle as recited in claim 2, wherein a thickness of said weakly scattering membrane and a thickness of said strongly scattering regions are determined in combination with a size of a contrast aperture to simultaneously adjust proximity effect correction dosage boost and local Coulomb effect space charge density.

5. A charged particle projection reticle as recited in claim 1 in which some areas of said strongly scattering regions are coextensive with areas of said weakly scattering membrane between said apertures.

6. A charged particle projection reticle as recited in claim 1 in which edges of some areas of said strongly scattering regions are recessed from said apertures.

7. A charged particle projection reticle as recited in claim 1 in which areas of said strongly scattering regions are distributed over areas of said weakly scattering membrane.

8. A charged particle projection reticle as recited in claim 2 in which some areas of said strongly scattering regions are coextensive with areas of said weakly scattering membrane between said apertures.

9. A charged particle projection reticle as recited in claim 2 in which edges of some areas of said strongly scattering regions are recessed from said apertures.

10. A charged particle projection reticle as recited in claim 2 in which areas of said strongly scattering regions are distributed over areas of said weakly scattering membrane.

11. A charged particle projection reticle as recited in claim 3 in which some areas of said strongly scattering regions are coextensive with areas of said weakly scattering membrane.

12. A charged particle projection reticle as recited in claim 3 in which edges of some areas of said strongly scattering regions are recessed from said apertures.

13. A charged particle projection reticle as recited in claim 3 in which areas of said strongly scattering regions are distributed over areas of said weakly scattering membrane.

14. A charged particle projection reticle as recited in claim 4 in which some areas of said strongly scattering regions are coextensive with areas of said weakly scattering membrane between said apertures.

15. A charged particle projection reticle as recited in claim 4 in which edges of some areas of said strongly scattering regions are recessed from said apertures.

16. A charged particle projection reticle as recited in claim 4 in which areas of said strongly scattering regions are distributed over areas of said weakly scattering membrane.

17. A charged particle projection reticle as recited in claim 1, wherein said strongly scattering regions are formed of strongly scattering material.

18. A charged particle projection reticle as recited in claim 1, wherein said strongly scattering regions are formed of an effective thickness of weakly scattering material.

19. A charged particle projection reticle as recited in claim 1, wherein said weakly scattering membrane is includes a layer of weakly scattering material.

20. A charged particle projection reticle as recited in claim 1, wherein said weakly scattering membrane is includes a thin layer of of strongly scattering material.

21. A method of performing charged particle beam projection lithography including the steps of
    distributing strongly scattering regions on a weakly scattering reticle having apertures therein, and
    projecting a beam of charged particles through said reticle and a contrast aperture onto a target whereby at least three levels of charged particle flux are developed to approximately compensate proximity effect and local Coulomb effect simultaneously.

22. A method as recited in claim 21, wherein said distributing step includes the further step of
    proportioning an area of said strongly scattering regions to an area of weakly scattering membrane in accordance with feature density on said reticle.

23. A method as recited in claim 21, wherein said distributing step includes the further step of
    determining relative thicknesses of said membrane and material of said strongly scattering regions in accordance with a size of said contrast aperture to adjust relative dose projected onto said target.

24. A method as recited in claim 22, wherein said distributing step includes the further step of
    determining relative thicknesses of said membrane and material of said strongly scattering regions in accordance with a size of said contrast aperture to adjust relative dose projected onto said target.

25. A method as recited in claim 21, wherein said target includes a hybrid doped resist.

26. A method of fabricating an electronic device including
exposing a resist layer on a semiconductor material by charged particle beam projection lithography wherein the exposing step includes
distributing strongly scattering regions on a weakly scattering reticle having apertures therein, and
projecting a beam of charged particles through said reticle and a contrast aperture onto a target whereby at least three levels of charged particle flux are developed to approximately compensate proximity effect and local Coulomb effect simultaneously,
developing the resist to form a pattern of said resist on said semiconductor material, and
processing areas of said semiconductor material exposed by said resist pattern.

27. A method as recited in claim 26, wherein said distributing step includes the further step of
proportioning an area of said strongly scattering regions to an area of weakly scattering membrane in accordance with feature density on said reticle.

28. A method as recited in claim 26, wherein said distributing step includes the further step of
determining relative thicknesses of said membrane and said material of said strongly scattering regions in accordance with a size of said contrast aperture to adjust relative dose projected onto said target.

29. A method as recited in claim 27, wherein said distributing step includes the further step of
determining relative thicknesses of said membrane and material of said strongly scattering regions in accordance with a size of said contrast aperture to adjust relative dose projected onto said target.

30. A method as recited in claim 26, wherein said target includes a hybrid doped resist.

* * * * *